United States Patent
Liu

(10) Patent No.: US 8,247,956 B2
(45) Date of Patent: Aug. 21, 2012

(54) LED ILLUMINATING DEVICE

(75) Inventor: Tay-Jian Liu, Taipei Hsien (TW)

(73) Assignee: Foxconn Technology Co., Ltd., Tu-Cheng, New Taipei (TW)

( * ) Notice: Subject to any disclaimer, the term of this patent is extended or adjusted under 35 U.S.C. 154(b) by 510 days.

(21) Appl. No.: 12/581,170

(22) Filed: Oct. 19, 2009

(65) Prior Publication Data

US 2011/0006657 A1    Jan. 13, 2011

(30) Foreign Application Priority Data

Jul. 7, 2009  (CN) .......................... 2009 1 0304086

(51) Int. Cl.
*H01J 7/24* (2006.01)
*H01J 7/28* (2006.01)

(52) U.S. Cl. ................. 313/46; 313/34; 313/35; 313/36

(58) Field of Classification Search .................... 313/12, 313/22, 34–36, 46, 512

See application file for complete search history.

(56) References Cited

U.S. PATENT DOCUMENTS 5,305,184 A * 4/1994 Andresen et al. ............. 361/699
7,661,463 B2 * 2/2010 Liu .......................... 165/104.14
2006/0082271 A1 * 4/2006 Lee et al. ........................ 313/35

* cited by examiner

*Primary Examiner* — Anh Mai
*Assistant Examiner* — Nathaniel Lee
(74) *Attorney, Agent, or Firm* — Altis Law Group, Inc.

(57) ABSTRACT

An LED illuminating device includes a housing defining a sealed boiling room, an optical module and an adiabatic member. The boiling room has a lower room and annular room surrounding the lower room. A wick structure is received in and attached to an inner side of the housing. Working fluid is received in the boiling room and saturated in a bottom portion of the wick structure located at a bottom of the lower room. The optical module is provided with a plurality of LEDs attached to the housing at a position under the bottom portion of the wick structure. The adiabatic member is received in the boiling room and attached to a middle portion of the wick structure at a top of the lower room for avoiding thermal and flow interactions between liquid in the middle portion of the wick structure and vapor in the lower room.

20 Claims, 5 Drawing Sheets

US 8,247,956 B2

LED ILLUMINATING DEVICE

BACKGROUND

1. Technical Field

The disclosure generally relates to light emitting diode (LED) illuminating devices, and particularly to an LED illuminating device with a high heat dissipating efficiency.

2. Description of Related Art

Presently, LEDs (light emitting diodes) are preferred for use in LED illuminating devices rather than CCFLs (cold cathode fluorescent lamps) due to a high brightness, a long lifespan, and a wide color range of the LED.

For an LED, eighty percents to ninety percents of the power consumed by the LED is converted into thermal energy, and only ten percents to twenty percents of the power consumed by the LED is converted into light. In addition, a plurality of LEDs are generally packaged in a single LED illuminating device in order to obtain a desirable illumination brightness. Conventional heat dissipation devices, such as metal heat sinks, can no longer satisfy the heat dissipation requirement of the high brightness LED illuminating device. Therefore, heat dissipation of the LED illuminating device is a problem inhibiting the application of the LED illuminating device, which requires to be resolved.

Therefore, it is desirable to provide an LED illuminating device with a high heat dissipating efficiency.

DETAILED DESCRIPTION

Figure 1:
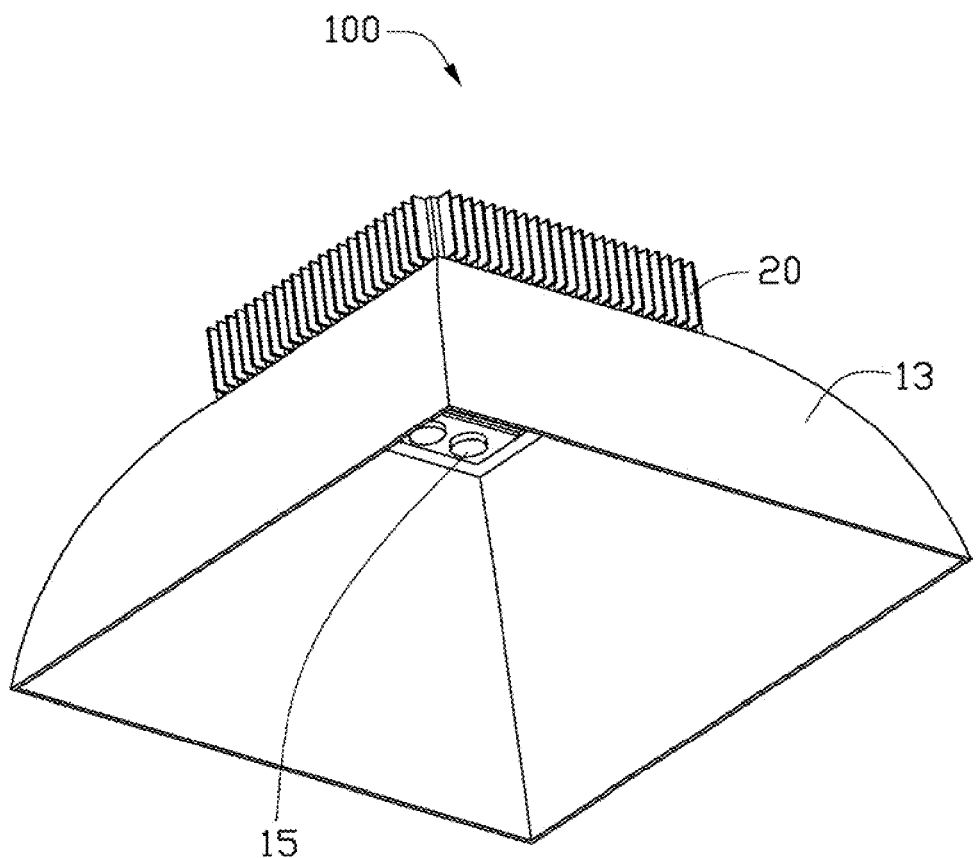
FIG. 1 is an isometric, assembled view of an LED illuminating device in accordance with an exemplary embodiment.
Figure 2:
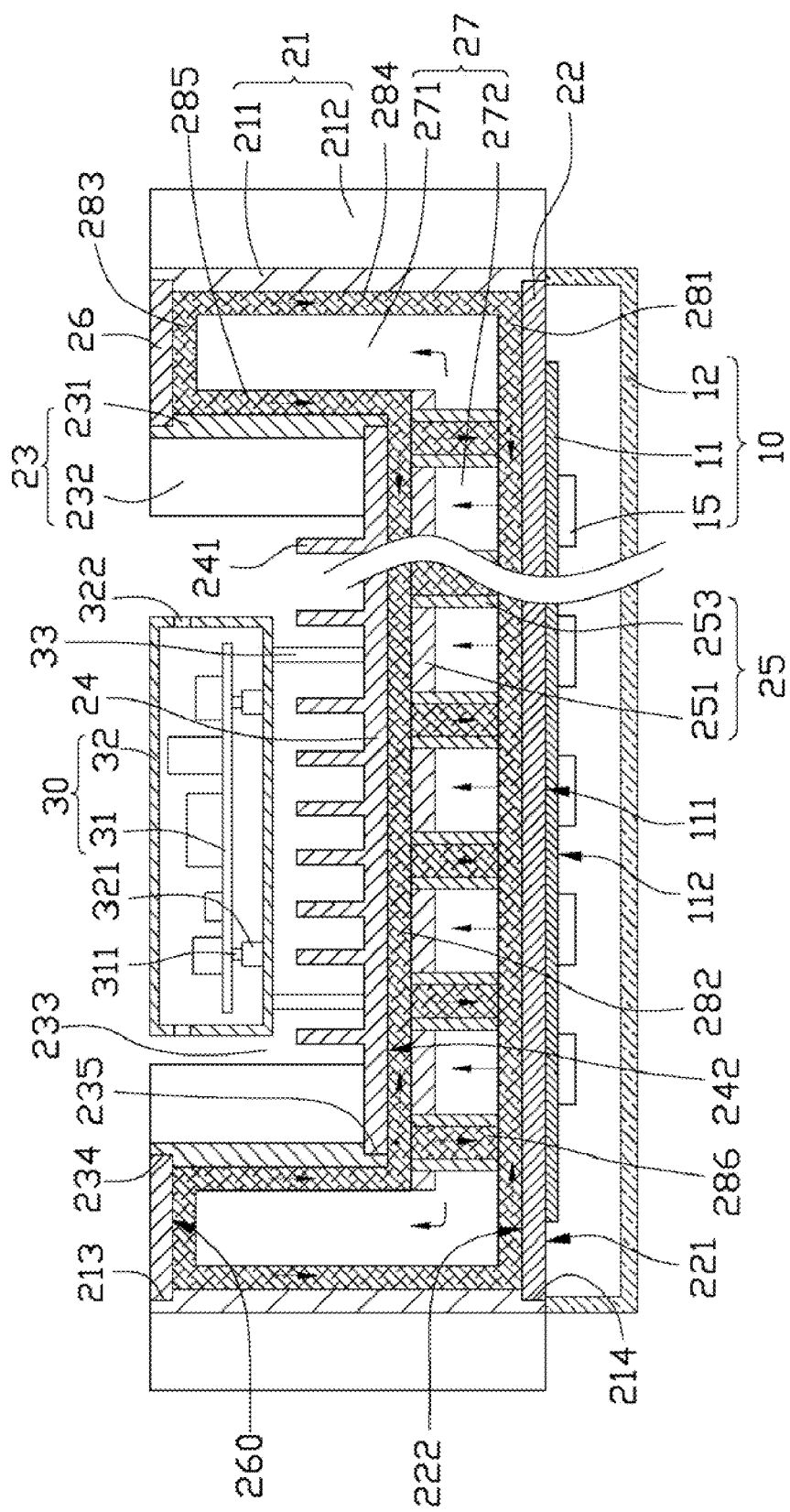
FIG. 2 is a cross sectional view of the LED illuminating device of FIG. 1, with a lampshade thereof being omitted.

Referring to FIGS. 1 and 2, an LED illuminating device 100 according to an embodiment of the present disclosure includes an optical module 10, a heat dissipation module 20, and an electric module 30.

The optical module 10 is arranged at a bottom side of the heat dissipation module 20. The optical module 10 includes a substrate 11, a plurality of LEDs 15, a lens 12, and a lampshade 13. The lampshade 13 is hollow. A top end of the lampshade 13 is connected to an outer periphery of the bottom side of the heat dissipation module 20. The lampshade 13 expands downwardly, and thus has a cross section gradually increased along a top-to-bottom direction. The substrate 11, the LEDs 15 and the lens 12 are received in the lampshade 13, and thus are prevented from being polluted by dust. Furthermore, the lampshade 13 helps the light generated by the LEDs 15 to be focused downwardly. The substrate 11 is flat, and has a planar top surface 111 attached to the bottom side of the heat dissipation module 20 and an opposite planar bottom surface 112. The LEDs 15 are fixed on the bottom surface 112 of the substrate 11 with emitting surfaces thereof facing downwards. The lens 12 is arranged under the LEDs 15 to provide luminescence characteristics for the LEDs 15. Light emitted by the LEDs 15 is refracted and guided by the lens 12 to illuminate an outside.

For enhancing a heat conduction efficiency between the substrate 11 and the heat dissipation module 20, a layer of thermal interface material (TIM) can be applied between the top surface 111 of the substrate 11 and the bottom side of the heat dissipation module 20 to eliminate an air interstice therebetween. Alternatively, the top surface 111 of the substrate 11 can be attached to the bottom side of the heat dissipation module 20 fixedly and intimately through surface mount technology (SMT), whereby an interface between the substrate 11 and the heat dissipation module 20 can be eliminated and a thermal resistance between the LEDs 15 and the heat dissipation module 20 is much reduced.

The electric module 30 is received in an upper portion of the heat dissipation module 20. The electric module 30 includes a casing 32 and a circuit board 31 received in the casing 32. The circuit board 31 is used for providing drive power, control circuit and power management for the LEDs 15. Wires (not shown) extend from the circuit board 31 through the casing 32 to respectively connect with the LEDs 15 and an external power source; thus, electric current can be supplied to the LEDs 15 to cause the LEDs 15 to emit light.

A plurality of exchanging holes 322 extend through a side plate of the casing 32 adjacent to a top plate of the casing 32 for exchanging hot air in the casing 32 which is heated by the circuit board 31 and cool air out of the casing 32, thereby heat generated by the circuit board 31 can be dissipated to outside. A plurality of connecting poles 33 extend downwardly from a bottom plate of the casing 32 to abut the heat dissipation module 20, thus to fix the electric module 30 onto the heat dissipation module 20. A plurality of supporting poles 321 extend upwardly from the bottom plate of the casing 32, and a plurality of positioning poles 311 extend downwardly from the circuit board 31 to respectively connect with the supporting poles 321 on the bottom plate of the casing 32. Thus the circuit board 31 is fixed into the casing 32 and supported by the supporting poles 321.

Figure 3:
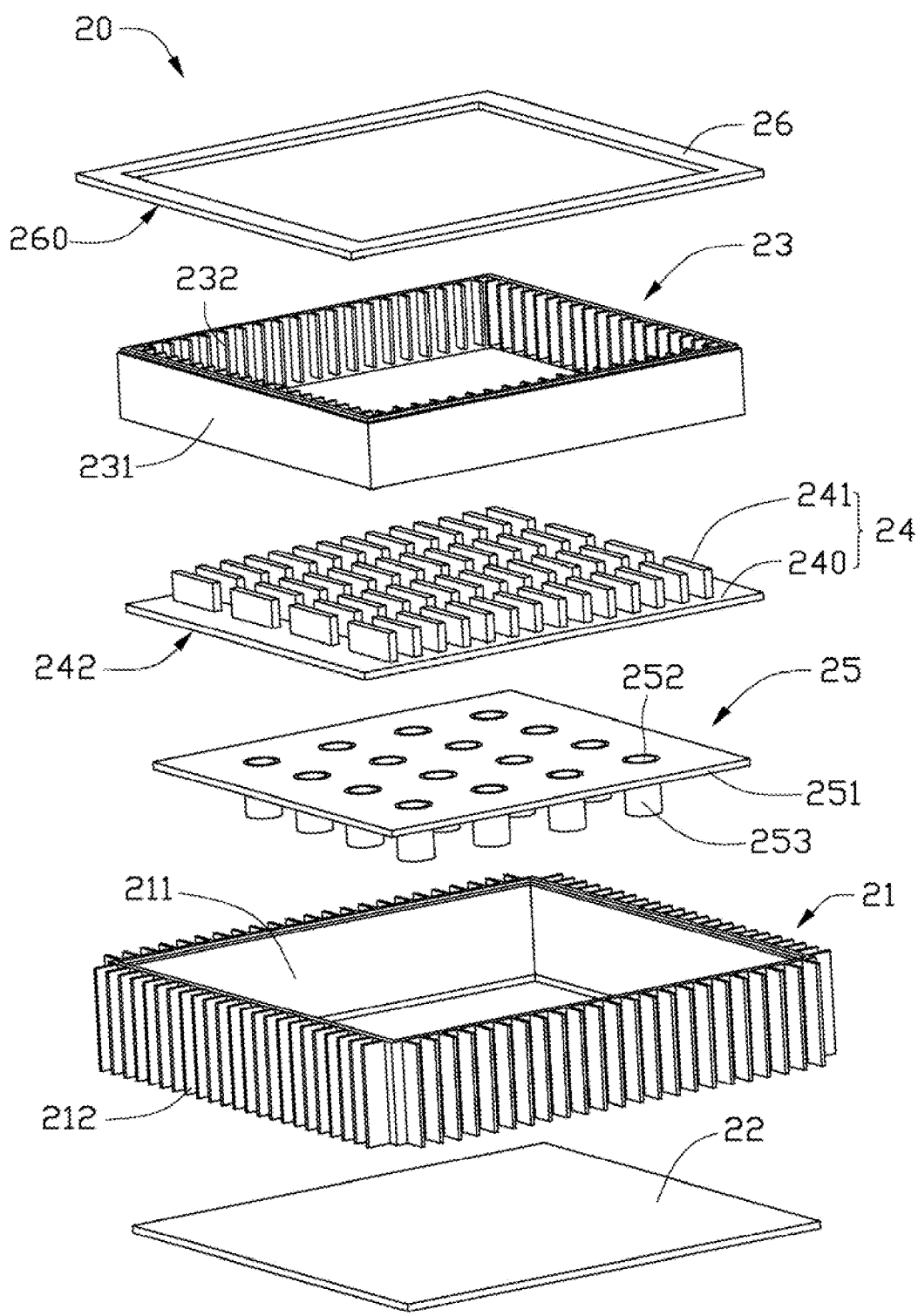
FIG. 3 is an isometric, exploded view of a heat dissipation module of the LED illuminating device of FIG. 1.

Referring to FIGS. 2 and 3, the heat dissipation module 20 is a loop heat exchange device, and includes an absorption member 22, an outer heat sink 21, an inner heat sink 23, a dissipation member 24, a sealing plate 26, a wick structure and an adiabatic member 25. The inner heat sink 23, the outer heat sink 21, the absorption member 22, the dissipation member 24 and the sealing plate 26 each are formed of a metal with good heat conductivity such as aluminum, copper or an alloy thereof. In this embodiment, the inner heat sink 23, the outer heat sink 21, the absorption member 22, the dissipation member 24 and the sealing plate 26 are individually formed and then connected together. In fact, two or more of these elements can be integrally formed, to thereby omit an assembly process of these individual elements.

In this embodiment, the absorption member 22 is rectangular and sheet. The absorption member 22 is arranged on the substrate 11 of the optical module 10 with a bottom surface 221 thereof attached to the top surface 111 of the substrate 11 closely. A size of the absorption member 22 is larger than that of the substrate 11, and thus an outer periphery of the bottom surface 221 of the absorption member 22 is exposed for assembling the lampshade 13 and the lens 12 thereon. It is to be understood that since the absorption member 22 is arranged on the substrate 11 to absorb heat of the LEDs 15, the shape of the absorption member 22 is similar with the shape of the substrate 11. In this embodiment, they are both rectangular. When the shape of the substrate 11 is changed, the shape of the absorption member 22 should be changed correspondingly.

The outer heat sink 21 is hollow, and includes an outer tube 211 and a plurality of outer fins 212 extending outwardly from an outer surface of the outer tube 211. The outer fins 212 are spaced from each other. The outer tube 211 has a cross section being rectangular. An outer size of the outer tube 211 is larger than the absorption member 22, while an inner size of the outer tube 211 is smaller than the absorption member 22. A bottom groove 214 is concaved outwardly from a bottom end of an inner surface of the outer tube 211 for receiving the absorption member 22 therein. A top groove 213 is concaved outwardly from a top end of the inner surface of the outer tube 211. The top groove 213 has a size the same as that of the bottom groove 214 of the outer heat sink 21.

The inner heat sink 23 includes an inner tube 231 and a plurality of inner fins 232. The inner tube 231 has a profile similar to that of the outer tube 211, being hollow and rectangular. A height of the inner tube 231 is smaller than that of the outer tube 211. An outer size of the inner tube 231 is smaller than the inner size of the outer tube 211. An inner groove 235 is concaved outwardly from a bottom end of an inner surface of the inner tube 231, while an outer groove 234 is concaved inwardly from a top end of an outer surface of the inner tube 231. The inner fins 232 extend inwardly from the inner surface of the inner tube 231. Free ends of the inner fins 232 are spaced from each other a distance. A space 233 is thus defined among the free ends of the inner fins 232 for receiving the electric module 30 therein.

The sealing plate 26 is rectangular and hollow. An outer size of the sealing plate 26 substantially equals to that of the absorption member 22 and the outer heat sink 21 defining an outer periphery of the top groove 213 of the outer tube 211, while an inner size of the sealing plate 26 substantially equals to the inner heat sink 23 defining an inner periphery of the outer groove 234 of the inner tube 231.

The dissipation member 24 includes a base 240 and a plurality of dissipation fins 241 on the base 240. The base 240 is rectangular and flat. An outer size of the base 240 substantially equals to the size of the inner heat sink 23 defining an outer periphery of the inner groove 235 of the inner tube 231. The dissipation fins 241 extend upwardly and integrally from a top face of the base 240.

When assembled, the inner heat sink 23 is coaxially received in the outer heat sink 21. The top end of the inner heat sink 23 is at the same level as the top end of the outer tube 211, while the bottom end of the inner tube 231 is higher than the bottom end of the outer tube 211. Since the outer size of the inner tube 231 is smaller than the inner size of the outer tube 211, an annular room 271 is defined between the inner tube 231 of the inner heat sink 23 and the outer tube 211 of the outer heat sink 21. The sealing plate 26 is arranged between the top ends of the inner tube 231 and the outer tube 211. Inner and outer peripheries of the sealing plate 26 are interferentially received in the outer groove 234 of the inner tube 231 and the top groove 213 of the outer tube 211, respectively. Thus a top end of the annular room 271 is hermetically sealed by the sealing plate 26.

The absorption member 22 couples to and hermetically seals the bottom end of the outer tube 211. An outer periphery of the absorption member 22 is interferentially received in the bottom groove 214 of the outer tube 211. Accordingly, a bottom end of the annular room 271 is sealed by the absorption member 22. The dissipation member 24 is arranged at and hermetically seals the bottom end of the inner tube 231. An outer periphery of the dissipation member 24 is interferentially received in the inner groove 235 of the inner tube 231. The dissipation fins 241 of the dissipation member 24 extend into the space 233 among the inner fins 232 of the inner heat sink 23. The electric module 30 received in the space 233 has the casing 32 thereof located over the dissipation fins 241 and the connecting poles 33 thereof extending through the space 233 among the dissipation fins 241 to be fixed on a top surface of the base 240 of the dissipation member 24.

Since the bottom end of the inner tube 231 is higher than the bottom end of the outer tube 211, the dissipation member 24 spaces from the absorption member 22 a distance in a height direction, and thus a lower room 272 is defined between the absorption member 22 and the base 240 of the dissipation member 24. The lower room 272 is surrounded by a lower portion of the annular room 271, and communicates with the annular room 271 via the lower portion thereof. Cooperatively, the inner tube 231 of the inner heat sink 23, the outer tube 211 of the outer heat sink 21, the sealing plate 26, the absorption member 22, and the base 240 of the dissipation member 24 form a sealed boiling room 27 consisting of the annular room 271 and the lower room 272. The inner heat sink 23, the outer heat sink 21, the sealing plate 26, the absorption member 22 and the dissipation member 24 cooperatively form a housing for the LED illuminating device 100. Before the boiling room 27 is sealed, the boiling room 27 is vacuumed and a working fluid such as water, alcohol, methanol, or the like, is injected into the boiling room 27.

In this embodiment, the wick structure is screen mesh. Alternatively, the wick structure can be sintered powder, fiber, metal foam, and tiny grooves. The wick structure is received in the boiling room 27. The wick structure includes a bottom portion 281 spread on the a top surface 222 of the absorption member 22, a top portion 283 spread on a bottom surface 260 of the sealing plate 26, a middle portion 282 spread on a bottom surface 242 of the base 240 of the dissipation member 24, an inner portion 285 spread on the outer surface of the inner tube 231, an outer portion 284 spread on the inner surface of the outer tube 211, and a plurality of connecting portions 286 arranged between the bottom portion 281 and the middle portion 282 and evenly spaced from each other. The working fluid injected in the boiling room 27 is saturated mainly in the bottom portion 281 of the wick structure.

The inner portion 285 and the outer portion 284 of the wick structure are vertical. The outer portion 284 surrounds and spaces a distance from the inner portion 285. The bottom portion 281, the middle portion 282 and the top portion 283 of the wick structure each are horizontal, and parallel to each other. The top portion 283 interconnects top ends of the inner portion 285 and the outer portion 284. The middle portion 282 connects a bottom end of the inner portion 285 at an outer periphery thereof. The bottom portion 281 connects a bottom end of the outer portion 284 at an outer periphery thereof. That is, the outer portion 284 interconnects an outer periphery of the top portion 283 and the outer periphery of the bottom portion 281, while the inner portion 285 interconnects an inner periphery of the top portion 283 and the outer periphery of the middle portion 282.

Figure 4:
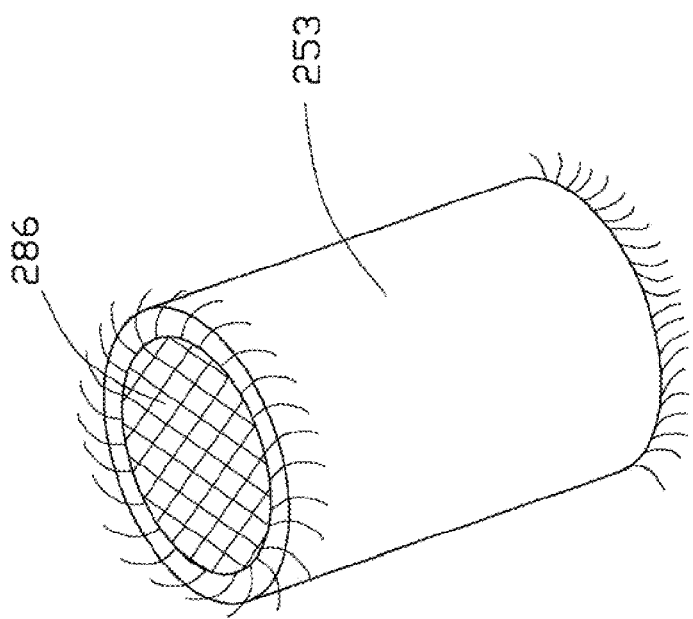
FIG. 4 is a schematic view of a cylinder of an adiabatic member of the heat dissipation module of FIG. 3.

The adiabatic member 25 includes an adiabatic plate 251 and a plurality of cylinders 253 extending downwardly from the adiabatic plate 251. The cylinders 253 are substantially evenly distributed on the adiabatic plate 251. A through hole 252 extends though each of the cylinders 253 and a corresponding portion of the adiabatic plate 251. Referring to FIG. 4, the adiabatic member 25 is received in the lower room 272 of the boil room 27 with a top surface of the adiabatic plate 251 abutting a bottom side of the middle portion 282 of the wick structure, and bottom ends of the cylinders 253 abutting a top side of the bottom portion 281 of the wick structure. The connecting portions 286 of the wick structure are respectively received in the through holes 252 of the adiabatic member 25.

Top and bottom ends of each connecting portion 286 respectively attach the middle portion 282 and the bottom portion 281 of the wick structure.

In operation, heat generated by the LEDs 15 is conducted to the substrate 11 and then to the absorption member 22. The heat of the LEDs 15 is then rapidly transferred from the absorption member 22 to the working fluid in the boiling room 27. The working fluid boils immediately and vaporizes into vapor. For the adiabatic plate 251 of the adiabatic member 25 arranged at the bottom side of the middle portion 282 of the wick structure, the middle portion 282 of the wick structure and the dissipation member 24 over the adiabatic plate 251 are approximately thermally and physically isolated from the vapor. In addition, the cylinders 253 of the adiabatic member 25 insulate the connecting portions 286 of the wick structure received therein from the vapor. In other words, heat carried by the vapor can not directly released to the dissipation member 24, the middle portion 282 of the wick structure and the connecting portions 286 of the wick structure. Thus the vapor accumulates in the lower room 272 and then flows upwardly into the annular room 271 of the boiling room 27, as indicated by arrows in FIG. 2.

When the vapor goes up into the annular room 271 of the boiling room 27, part of the heat carried by the vapor is released to the outer tube 211 of the outer heat sink 21, and then dissipated to ambient atmosphere by the outer fins 212 of the outer heat sink 21. Simultaneously, part of the heat carried by the vapor is released to the inner tube 231 of the inner heat sink 23, and then dissipated to ambient atmosphere by the inner fins 232 of the inner heat sink 23. After the vapor releases the heat, the vapor is condensed into liquid. The condensed liquid is absorbed by the inner portion 285 of the wick structure arranged on the inner heat sink 23 and the outer portion 284 of the wick structure arranged on the outer heat sink 21, respectively. Finally, the condensed liquid in the outer portion 284 of the wick structure is directly drawn back to the bottom portion 281 of the wick structure via the capillary force of the outer portion 284.

In addition, the condensed liquid in the inner portion 285 of the wick structure is firstly drawn back to the middle portion 282 of the wick structure via the capillary force of the middle portion 282. As stated above, the middle portion 282 and the connecting portions 286 of the wick structure are insulated from the vapor, and thus the condensed liquid flows back into the middle portion 282 and the connecting portions 286 of the wick structure does not exchange heat with the vapor in the lower room 272 of the boiling room 27. Further, when the condensed liquid flows across the middle portion 282, the base 240 of the dissipation member 24 on the middle portion 282 can absorb heat from the condensed liquid and then transfer the heat to the dissipation fins 241 on the base 240 for further dissipation. Thus the condensed liquid can be further cooled when flows across the middle portion 282 of the wick structure. Finally the further cooled liquid is drawn back to the bottom portion 281 of the wick structure by capillary force provided by the connecting portions 286. The liquid returned back to the bottom portion 281 of the wick structure is available for a next phase change cycle, whereby the heat of the LEDs 15 is continuously and effectively removed by the loop-type heat dissipation module 20.

In the present LED illuminating device 100, the vapor flows along the lower room 272 to the annular room 271 to dissipate heat, while the liquid flows back along the wick structure. In other words, the vapor and the liquid flow along different passages. For the adiabatic member 25 arranged in the lower room 272 of the boiling room 27, the liquid is insulated from the vapor in the lower room 272. Thus both thermal and flow interactions between the vapor and the liquid in the lower room 272 of the present LED illuminating device 100 are avoided. Flow resistances of both the vapor and the liquid are lowered; thus the vapor can timely take away the heat of the LEDs 15, while the liquid can timely flow back to begin a new cycle. Accordingly, the heat dissipation module 20 can take away the heat of the LEDs 15 more efficiently.

Figure 5:
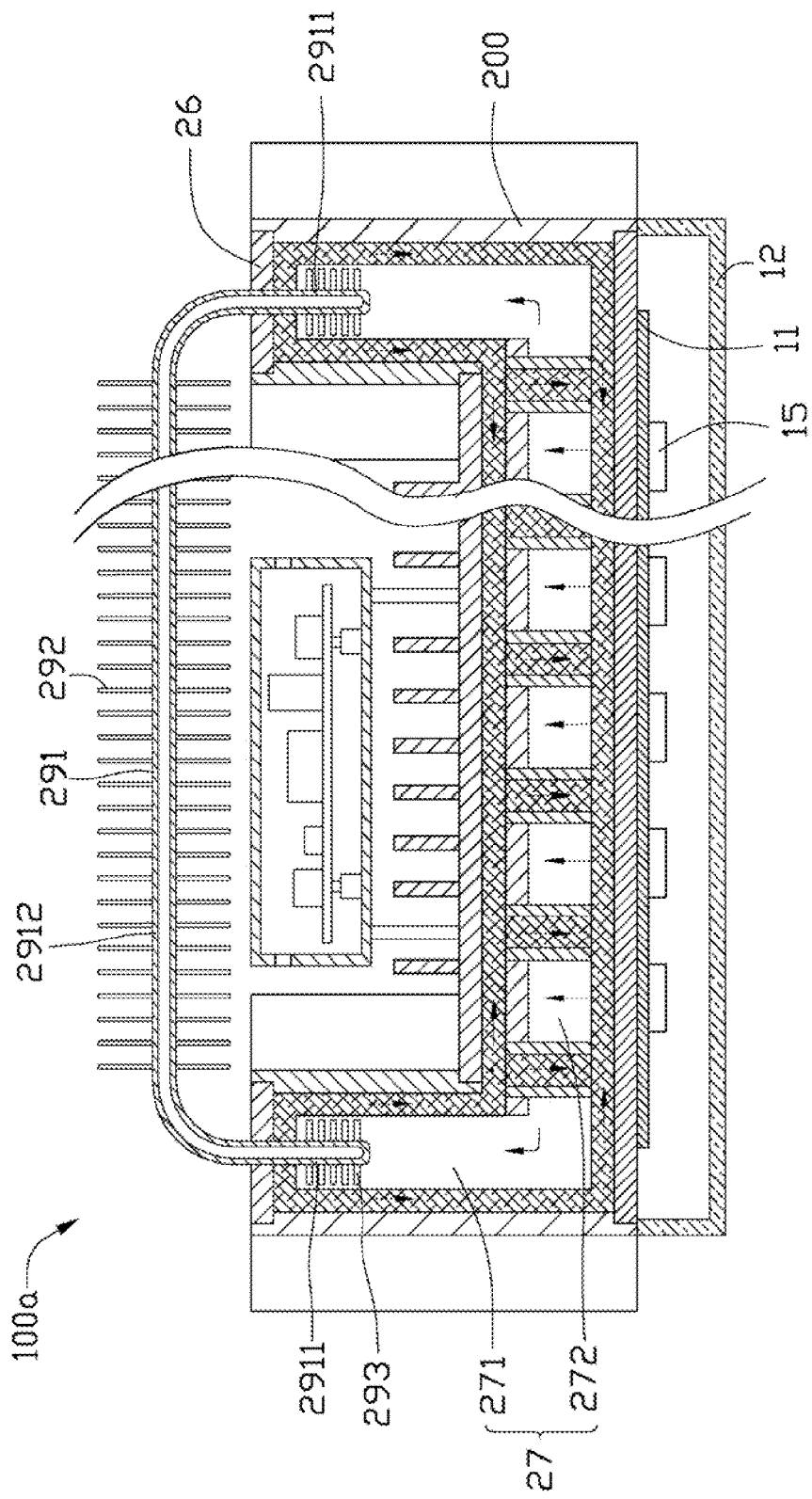
FIG. 5 is a cross sectional view of an LED illuminating device according to an alternative embodiment.

Referring to FIG. 5, an LED illuminating device 100a according to an alternative embodiment is illustrated. Except the following differences, the LED illuminating device 100a of the present embodiment is essentially the same as the LED illuminating device 100 shown in FIGS. 1-4. In the present embodiment, a heat dissipation module 200 of the LED illuminating device 100a further includes a heat pipe 291, and a plurality of exchanging fins 292. The heat pipe 291 is substantially U-shaped, including a pair of evaporators 2911 at two ends thereof and a condensation 2912 at a middle thereof. The exchanging fins 292 are fixedly arranged around the condensation 2912 of the heat pipe 29. The two evaporators 2911 extend through the sealing plate 26 of the heat dissipation module 200 into a top portion of the annular room 271. Further, a plurality of absorption fins 293 are arranged around each of the evaporators 2911 for increasing a heat exchanging area of the evaporators 2911 of the heat pipe 291 with the vapor. Thus the heat pipe 291 can take away heat from the vapor more quickly, further enhancing a heat dissipation efficiency of the LED illuminating device 100a.

It is to be understood, however, that even though numerous characteristics and advantages of the present invention have been set forth in the foregoing description, together with details of the structure and function of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An LED illuminating device, comprising:
   a boiling room defined among an outer tube, an inner tube coaxially received in the outer tube with a bottom end thereof higher than a bottom end of the outer tube, an absorption member coupling to and sealing the bottom end of the outer tube, a dissipation member coupling to and sealing the bottom end of the inner tube, and a sealing plate arranged between top ends of the outer tube and the inner tube, the boiling room comprising a lower room being defined between the dissipation member and the absorption member, and an annular room being defined between the inner tube and the outer tube, a lower portion of the annular room surrounding the lower room;
   working fluid filled in the lower room of the boiling room;
   an optical module being provided with a plurality of LEDs attached to the absorption member;
   an electrical module being electrically connected with the LEDs; and
   an adiabatic member being received in the lower room of the boiling room and attached to the dissipation member to thermally insulate the dissipation member from vaporized working fluid in the lower room of the boiling room.

2. The LED illuminating device of claim 1, wherein the adiabatic member comprises an adiabatic plate attached to the dissipation member and a plurality of cylinders extending downwardly from the adiabatic plate towards the absorption member.

3. The LED illuminating device of claim 2, further comprising a wick structure arranged in the boiling room, the wick structure comprising a bottom portion arranged between the absorption member and the cylinders, a middle portion between the adiabatic plate and the dissipation member, and a plurality of connecting portions respectively extending through the cylinders to interconnect the bottom portion and the middle portion of the wick structure.

4. The LED illuminating device of claim 3, wherein the dissipation member comprises a base and a plurality of dissipation fins extending upwardly from the base, the base coupling to and sealing the bottom end of the inner tube.

5. The LED illuminating device of claim 4, wherein the wick structure further comprises an inner portion spread on the inner tube with a bottom end thereof connected to an outer periphery of the middle portion, and an outer portion spread on the outer tube with a bottom end thereof connected to an outer periphery of the bottom portion.

6. The LED illuminating device of claim 5, further comprising a plurality of inner fins extending inwardly from an inner surface of the inner tube.

7. The LED illuminating device of claim 6, wherein a space is defined among the inner fins receiving the electric module, a plurality of connecting poles extending downwardly from the electric module and fixed onto the base of the dissipation member.

8. The LED illuminating device of claim 7, wherein the electrical module comprises a casing arranged over the dissipation fins and a circuit board received in the casing, a plurality of air passage holes being provided through a circumferential periphery of the casing, the LEDs being electrically connected with the circuit board.

9. The LED illuminating device of claim 5, further comprising a plurality of outer fins extending outwardly from an outer surface of the outer tube.

10. The LED illuminating device of claim 5, wherein the wick structure further comprises a top portion spread on the sealing plate and interconnecting top ends of the inner portion and the outer portion.

11. The LED illuminating device of claim 1, further comprising a heat pipe having evaporators formed at opposite ends and condensation formed at a middle thereof, the evaporators of the heat pipe extending through the sealing plate into the annular room to absorb heat therefrom, a plurality of exchanging fins being fixed around the condensation of the heat pipe for dissipating heat absorbed from the boiling room.

12. The LED illuminating device of claim 11, further comprising a plurality of absorption fins arranged around each of the evaporators.

13. An LED illuminating device, comprising:
a housing having an inner side defining a sealed boiling room having a lower room and an annular room having a lower portion surrounding the lower room;
a wick structure received in the boiling room and attached to the inner side of the housing;
working fluid received in the boiling chamber and saturated in a bottom portion of the wick structure located in a bottom of the lower room;
an optical module being provided with a plurality of LEDs attached to the housing at a position under the bottom portion of the wick structure; and
an adiabatic member being received in the boiling room and attached to a middle portion of the wick structure in a top of the lower room for thermally insulating the middle portion of the wick structure from vaporized working fluid in the lower room of the boiling room.

14. The LED illuminating device of claim 13, wherein the housing comprises an outer tube, an inner tube coaxially received in the outer tube with a bottom end higher than a bottom end of the outer tube, an absorption member coupling to and sealing the bottom end of the outer tube, a dissipation member coupling to and sealing the bottom end of the inner tube, and a sealing plate between a top end of the outer tube and a top end of the inner tube, the lower room being defined between the dissipation member and the absorption member, the annular room being defined between the inner tube and the outer tube surrounding the lower room, the middle portion of the wick structure being attached to a bottom of the dissipation member, the bottom portion of the wick structure being arranged on a top of the absorption member.

15. The LED illuminating device of claim 14, wherein the wick structure further comprising an inner portion spread on the inner tube with a bottom end thereof connected to an outer periphery of the middle portion, and an outer portion spread on the outer tube with a bottom end thereof connected to an outer periphery of the bottom portion, and a plurality of connecting portions interconnecting the bottom portion and the middle portion.

16. The LED illuminating device of claim 15, wherein the adiabatic member comprises an adiabatic plate attaching to the middle portion of the wick structure and a plurality of cylinders extending downwardly from the adiabatic plate to the bottom portion of the wick structure, the connecting portions of the wick structure being respectively received in the cylinders of the adiabatic member.

17. The LED illuminating device of claim 15, further comprising a plurality of outer fins extending outwardly from an outer surface of the outer tube, and a plurality of inner fins extending inwardly from an inner surface of the inner tube.

18. The LED illuminating device of claim 17, wherein the dissipation member comprises a base and a plurality of dissipation fins extending upwardly from the base, the base coupling to and sealing the bottom end of the inner tube, a space being defined among the inner fins receiving an electric module therein, the electrical module comprising a casing arranged over the dissipation fins and a circuit board received in the casing, a plurality of connecting poles extending downwardly from the electric module and fixed onto the base of the dissipation member to fix the electric module onto the housing defining the boiling room, a plurality of air passage holes being provided through a circumferential periphery of the casing, the LEDs being electrically connected with the circuit board.

19. The LED illuminating device of claim 14, further comprising a heat pipe having evaporators formed at opposite ends and condensation formed at a middle thereof, the evaporators of the heat pipe extending through the sealing plate into the annular room to absorb heat therefrom, a plurality of exchanging fins being fixed around the condensation of the heat pipe for dissipating heat absorbed from the boiling room.

20. The LED illuminating device of claim 19, further comprising a plurality of absorption fins arranged around each of the evaporators.

* * * * *